(12) United States Patent
Kitamoto et al.

(10) Patent No.: US 6,529,440 B2
(45) Date of Patent: Mar. 4, 2003

(54) SEMICONDUCTOR MEMORY DEVICE WITH REDUCED CURRENT CONSUMPTION

(75) Inventors: Ayako Kitamoto, Kawasaki (JP); Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/884,117

(22) Filed: Jun. 20, 2001

(65) Prior Publication Data

US 2002/0001895 A1 Jan. 3, 2002

(30) Foreign Application Priority Data

Jun. 30, 2000 (JP) ........................................ 2000-199715

(51) Int. Cl.[7] .............................................. G11C 8/00
(52) U.S. Cl. ............. 365/230.06; 365/207; 365/189.05; 365/189.01
(58) Field of Search ............................ 365/207, 230.06, 365/189.05, 189.07

(56) References Cited

U.S. PATENT DOCUMENTS

| | | | | | |
|---|---|---|---|---|---|
| 5,258,958 | A | * | 11/1993 | Iwahashi et al. | ........ 365/185.09 |
| 5,267,198 | A | * | 11/1993 | Hatano et al. | .............. 365/150 |
| 5,973,983 | A | * | 10/1999 | Hidaka | ........................ 365/203 |
| 6,061,297 | A | * | 5/2000 | Suzuki | ........................ 365/207 |

* cited by examiner

*Primary Examiner*—Vu A. Le
*Assistant Examiner*—Toan Le
(74) *Attorney, Agent, or Firm*—Arent Fox Kintner Plotkin & Kahn, PLLC.

(57) ABSTRACT

A semiconductor memory device includes a DQ-quantity-selection signal generation circuit which generates a DQ-quantity-selection signal indicative of a number of input/output data bits, bit lines which transfer read data and write data for memory cells, and a plurality of sense amplifiers which are connected to the bit lines, and are activated as many as indicated by the DQ-quantity-selection signal.

8 Claims, 13 Drawing Sheets

SEMICONDUCTOR MEMORY DEVICE WITH REDUCED CURRENT CONSUMPTION

BACKGROUND OF THE INVENTION

1. Field of the Invention

The present invention generally relates to semiconductor memory devices, and particularly relates to a semiconductor memory device that can reduce consumption of electric currents.

2. Description of the Related Art

There are semiconductor memory devices for which the number of input/output data bits can be changed. This is achieved by changing the number of column selection lines or by switching the outputs of data bus amplifiers.

In such related-art methods, consumption of electric currents in the integrated circuit as a whole almost does not change even when the number of input/output data bits is changed. This is because the current consumption during an activation period is attributable to sense amplifiers, i.e., attributable to electric currents related to amplification of bit lines. Unless the number of activated sense amplifiers is reduced, a substantial reduction in the current consumption cannot be achieved in semiconductor memory devices.

If a circuit design or architecture is substantially changed for the purpose of reducing current consumption, however, such a change incurs undesirable costs. Accordingly, it is desired to achieve a semiconductor memory device having a low current consumption by employing substantially the same circuit structure and architecture as in the related art.

Accordingly, there is a need for a semiconductor memory device that can reduce current consumption in accordance with the number of input/output data bits by changing the number of activated amplifiers.

SUMMARY OF THE INVENTION

It is a general object of the present invention to provide a semiconductor memory device that substantially obviates one or more of the problems caused by the limitations and disadvantages of the related art.

It is another and more specific object of the present invention to provide a semiconductor memory device that can reduce current consumption in accordance with the number of input/output data bits by changing the number of activated amplifiers.

In order to achieve the above objects according to the present invention, a semiconductor memory device includes a DQ-quantity-selection signal generation circuit which generates a DQ-quantity-selection signal indicative of a number of input/output data bits, bit lines which transfer read data and write data for memory cells, and a plurality of sense amplifiers which are connected to the bit lines, and are activated as many as indicated by the DQ-quantity-selection signal.

In the semiconductor memory device as described above, the number of sense amplifiers that are activated is controlled in response to the DQ-quantity-selection signal indicative of the number of input/output data bits, thereby achieving a reduction in the current consumption of the semiconductor memory device.

According to another aspect of the present invention, the semiconductor memory device as described above further includes input/output terminals through which data is output to and input from an exterior of the semiconductor memory device, data bus amplifiers which are situated between the sense amplifiers and the input/output terminals, and amplify the read data and the write data, and a data bus amplifier selection circuit which selectively activates the data bus amplifiers in accordance with the DQ-quantity-selection signal.

In the semiconductor memory device as described above, the number of data bus amplifiers that are activated is controlled in accordance with the number of input/output data bits, thereby achieving a further reduction of current consumption in the semiconductor memory device.

According to another aspect of the present invention, the semiconductor memory device as described above further includes a circuit which activates circuitry contained in a sense amplifier row that is not activated.

In the semiconductor memory device as described above, even when a given sense amplifier row is not activated, circuitry that needs to be driven in this sense amplifier row can be activated. Such circuitry may include a circuit that generates a sub-word-decoder activation signal.

According to another aspect of the present invention, the semiconductor memory device as described above is such that the sense amplifiers are selectively activated by a column address.

In the semiconductor memory device as described above, activation of the sense amplifiers is controlled based on the column address selection, thereby achieving a substantial reduction in current consumption.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
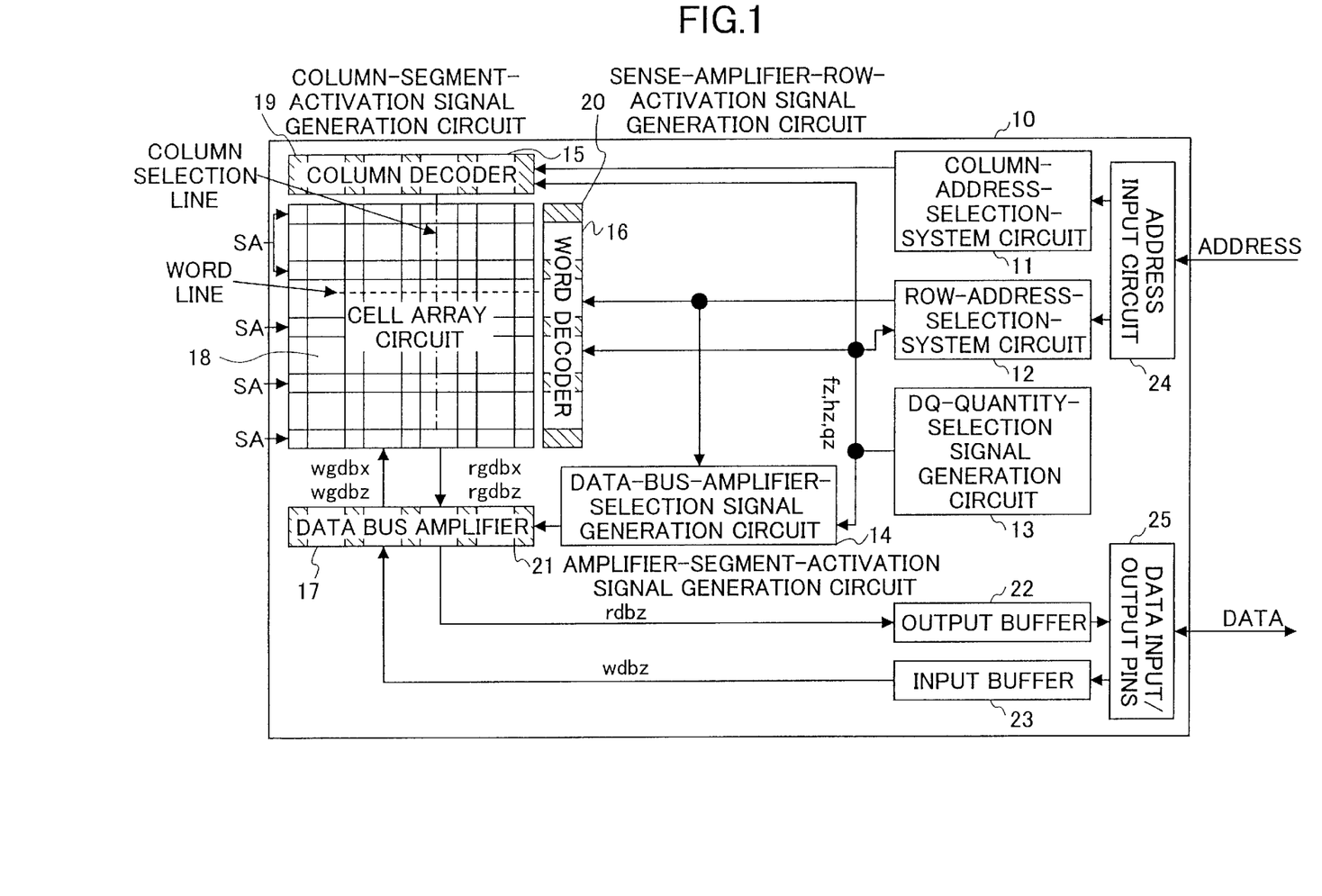
FIG. 1 is a block diagram of a semiconductor memory device according to the present invention.

FIG. 1 is a block diagram of a semiconductor memory device according to the present invention.

A semiconductor memory device 10 of FIG. 1 includes a column-address-selection-system circuit 11, a row-address-selection-system circuit 12, a DQ-quantity-selection signal generation circuit 13, a data-bus-amplifier-selection signal generation circuit 14, a column decoder 15, a word decoder 16, a data bus amplifier 17, a cell array circuit 18, a column-segment-activation signal generation circuit 19, a sense-amplifier-line-activation signal generation circuit 20, an amplifier-segment-activation signal generation circuit 21, an output buffer 22, an input buffer 23, an address input circuit 24, and data input/output pins 25.

The column-address-selection-system circuit 11 attends to address processing such as pre-decode processing of a column address that is input to the address input circuit 24. The processed column address is supplied to the column decoder 15.

The row-address-selection-system circuit 12 attends to address processing such as pre-decode processing of a row address that is input to the address input circuit 24. The processed row address is supplied to the word decoder 16.

The word decoder 16 activates a selected word line, thereby reading data from memory cells of the cell array circuit 18 at the selected row address. The read data are latched by sense amplifiers SA. The column decoder 15 activates a selected column selection line, thereby supplying data latched by the sense amplifiers SA to the data bus amplifier 17.

The data supplied to the data bus amplifier 17 is output to an exterior of the device from the data input/output pins 25 by using the output buffer 22.

During a data write operation, data that is supplied from the exterior of the device to the data input/output pins 25 is stored in memory cells of the cell array circuit 18 via the input buffer 23 and the data bus amplifier 17.

In the present invention, the DQ-quantity-selection signal generation-circuit 13 can change the number of input/output data bits (i.e., the number of DQs). In response to the number of input/output data bits, the DQ-quantity-selection signal generation circuit 13 changes a signal that it generates, thereby changing the number of activated sense amplifiers.

In detail, the DQ-quantity-selection signal generation circuit 13 generates a DQ-quantity-selection signal fz when setting the number of DQs equal to a maximum number (e.g., 32 bits). When setting the number of DQs equal to half the maximum number (e.g., 16 bits), the DQ-quantity-selection signal generation circuit 13 generates a DQ-quantity-selection signal hz. When setting the number of DQs equal to a quarter of the maximum number (e.g., 8 bits), the DQ-quantity-selection signal generation circuit 13 generates a DQ-quantity-selection signal qz.

Figure 2A:
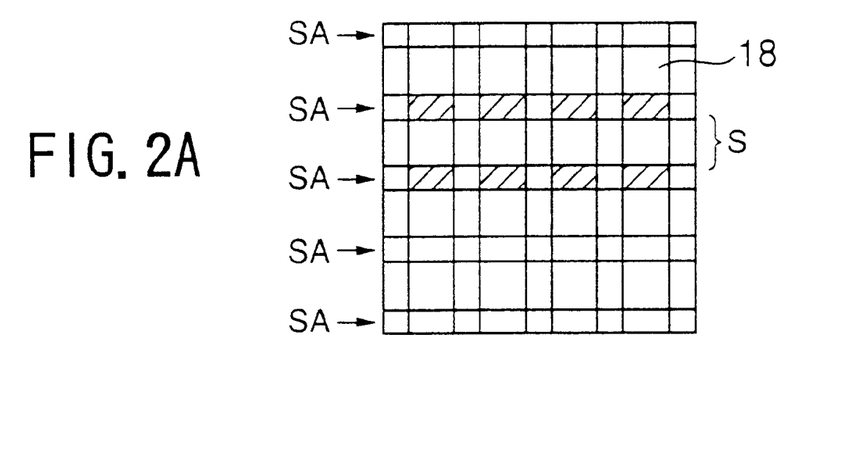
FIGS. 2A through 2C are illustrative drawing showing examples of changes in the number of activated sense amplifiers according to the present invention.
Figure 2B:
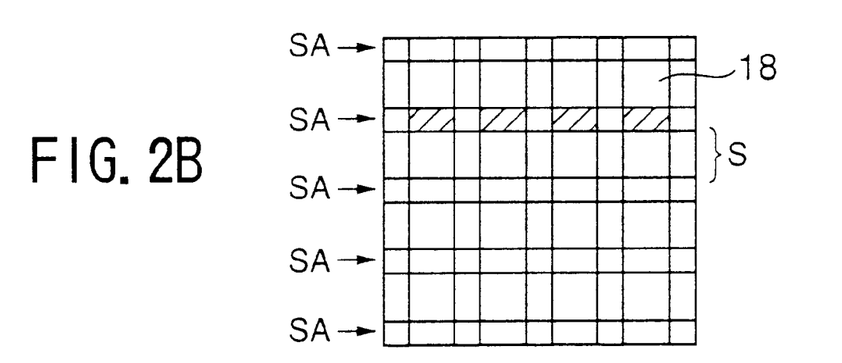
Figure 2C:
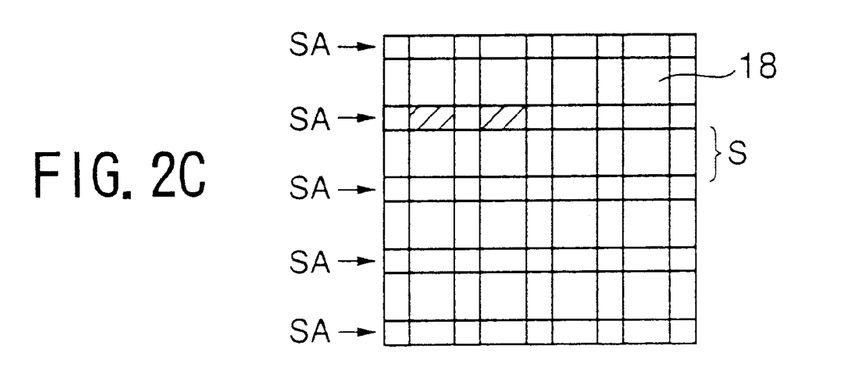

FIGS. 2A through 2C are illustrative drawing showing examples of changes in the number of activated sense amplifiers according to the present invention.

FIG. 2A shows sense amplifiers SA that are activated when the DQ-quantity-selection signal generation circuit 13 generates the signal fz to indicate the maximum number of DQs. Sense amplifiers SA that are situated in sense amplifier rows on-both sides of a selected row block S are activated as shown by hatches. FIG. 2B shows sense amplifiers SA that are activated when the DQ-quantity-selection signal generation circuit 13 generates the signal hz to indicate half the maximum number of DQs. Sense amplifiers SA that are situated in a sense amplifier row on one side of the selected row block S are activated as shown by hatches. FIG. 2C shows sense amplifiers SA that are activated when the DQ-quantity-selection signal generation circuit 13 generates the signal qz to indicate a quarter of the maximum number of DQs. Sense amplifiers SA that are half of the sense amplifiers in the sense amplifier row on one side of the selected row block S are activated as shown by hatches. Here, the spatial arrangement of the activated sense amplifiers for the row block S is determined by the row address.

In the present invention as described above, the number of activated sense amplifiers is adjusted in response to the number of input/output data bits, thereby reducing current consumption in the semiconductor memory device. The activated segment of sense amplifiers is not limited to the spatial arrangement of FIG. 2, but other spatial arrangements are possible. For example, the sense amplifiers may not be activated in consecutive column blocks (vertical lines) as shown in FIG. 2, but may be activated in every other column block.

For the purpose of adjusting the number of activated sense amplifiers, the DQ-quantity-selection signal generation circuit 13 supplies a signal to the row-address-selection-system circuit 12, the column-segment-activation signal generation circuit 19, the sense-amplifier-line-activation signal generation circuit 20, and the amplifier-segment-activation signal generation circuit 21.

Figure 3:
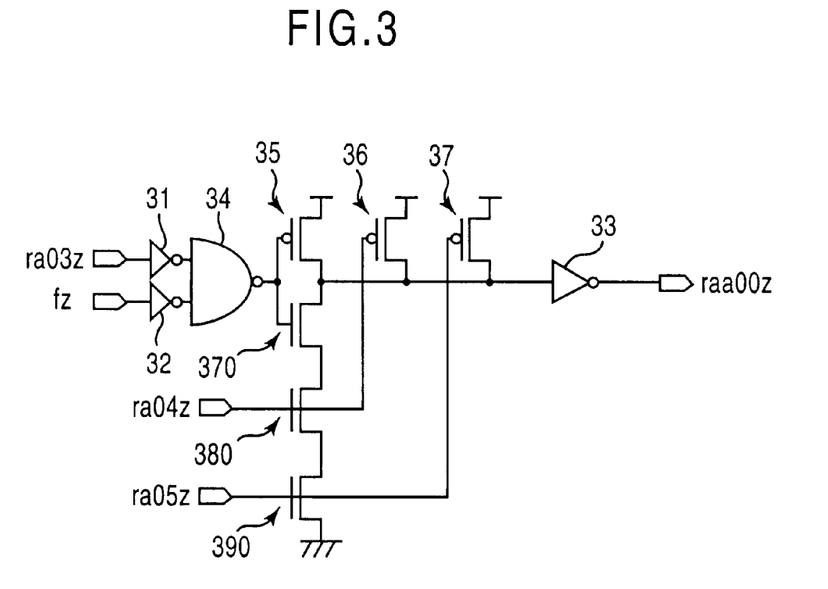
FIG. 3 is a circuit diagram showing part of a row-address-selection-system circuit.

FIG. 3 is a circuit diagram showing part of the row-address-selection-system circuit 12.

As previously described, the row-address-selection-system circuit 12 attends to pre-decoding of a row address. FIG. 3 shows a pre-decoder portion that generates a signal for selecting a main word decoder.

The circuit of FIG. 3 includes inverters 31 through 33, a NAND circuit 34, PMOS transistors 35 through 37, and NMOS transistors 370 through 390. When the signal fz supplied from the DQ-quantity-selection signal generation circuit 13 is LOW, a combination of three bits ra03z through ra05z of the row address signals will determine the signal level of the output signal. FIG. 3 shows a circuit that generates a signal raa00z for selecting the first main word decoder, and this signal raa00z becomes HIGH only when the three bits ra03z through ra05z of the row address signals are all HIGH. By using a circuit configuration similar to that of FIG. 3, inverted signals may be supplied in place of some of the three bits ra03z through ra05z, so that signals (raa00z through raa07z) may be generated that become HIGH for different combinations of these three bits ra03z through ra05z. Such circuits may be arranged in parallel, or similar decode signals are generated from different row address signals and combined, so that signals for selecting one from a plurality of main word decoders are generated.

In the configuration of FIG. 3, the signal fz is supplied to the circuit. When the signal fz is HIGH, the bit ra03z becomes irrelevant. This makes a combination of the remaining two bits ra04z and ra05z a controlling factor that determines the output signal regardless of the bit ra03z. In this case, therefore, two word decoders are simultaneously selected from the plurality of main word decoders.

In the present invention, two main word decoders can be simultaneously selected to activate two main word lines at the same time.

In the following, the significance of activation of two main word lines will be described.

Figure 4:
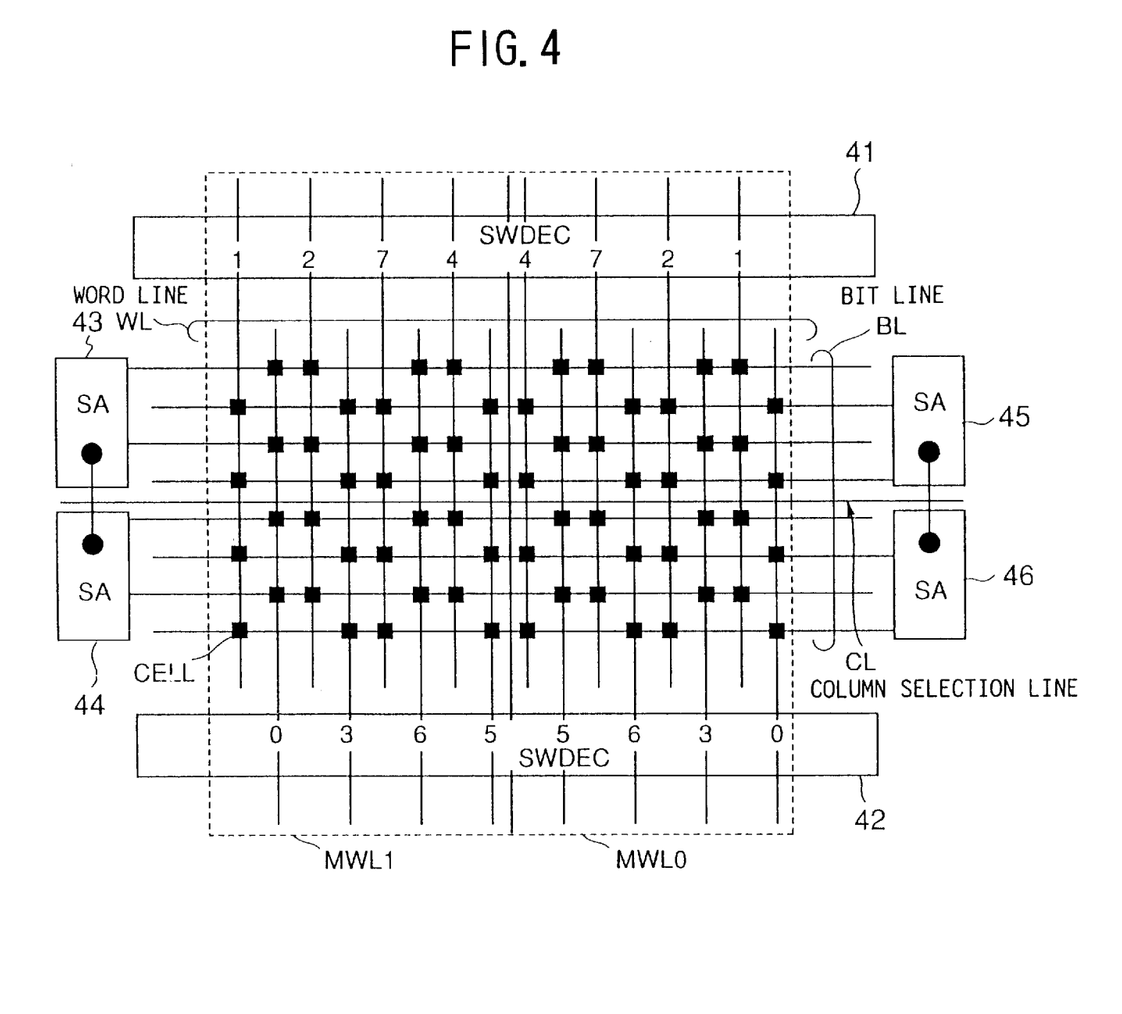
FIG. 4 is a circuit diagram showing connections between bit lines and sense amplifiers in the present invention.

FIG. 4 is a circuit diagram showing connections between bit lines and sense amplifiers in the present invention.

In FIG. 4, when a sub-word decoder 41 or 42 selects one of the word lines WL0 through WL7, data are read from memory cells CELL (solid rectangles in the figure) that are connected to the selected word line WL. These data are supplied to sense amplifiers 43 through 46 via bit lines BL. When an even-number main word line MWL0 is activated, for example, sub-word lines (word lines) WL that are driven in response are in the same spatial arrangement as the word lines shown in the dotted-line box on the right-hand side. When an odd-number main word line MWL1 is activated, on the other hand, sub-word lines (word lines) WL that are driven in response are in the same spatial arrangement as the word lines shown in the dotted-line box on the left-hand side. Between the right-hand side and the left-hand side, connections between the word lines WL and the memory cells CELL are different.

Namely, when the even-number word lines WL (0, 2, 4, 6) are activated inside the right dotted-line box, data of memory cells are supplied to the sense amplifiers 45 and 46 provided on the right-hand side. When the odd-number word lines WL (1, 3, 5, 7) are activated inside the right dotted-line box, data of memory cells are supplied to the sense amplifiers 43 and 44 provided on the left-hand side. On the other hand, when the even-number word lines WL (0, 2, 4, 6) are activated inside the left dotted-line box, data of memory cells are supplied to the sense amplifiers 43 and 44 provided on the left-hand side. When the odd-number word lines WL (1, 3, 5, 7) are activated inside the left dotted-line box, data of memory cells are supplied to the sense amplifiers 45 and 46 provided on the right-hand side.

When the signal fz is changed to HIGH in the configuration of FIG. 3 to merge the row address bit ra03z, two adjacent main word lines are activated. In this case, if the third word line (sub-word line) WL (3) is selected in the configuration of FIG. 4, data of the memory cells CELL inside the left dotted-line box are supplied to the sense amplifiers 45 and 46 on the right-hand side, and data of the memory cells CELL inside the right dotted-line box are supplied to the sense amplifiers 43 and 44 on the left-hand side.

In this manner, the signal fz is set to HIGH for the maximum number of DQs, so that two adjacent main word lines are activated to supply data of memory cells to two lines of sense amplifiers provided on both sides. When the number of DQs is not the maximum, only one main word line is activated, thereby supplying data of memory cells to one line of sense amplifiers provided on one side.

Figure 5:
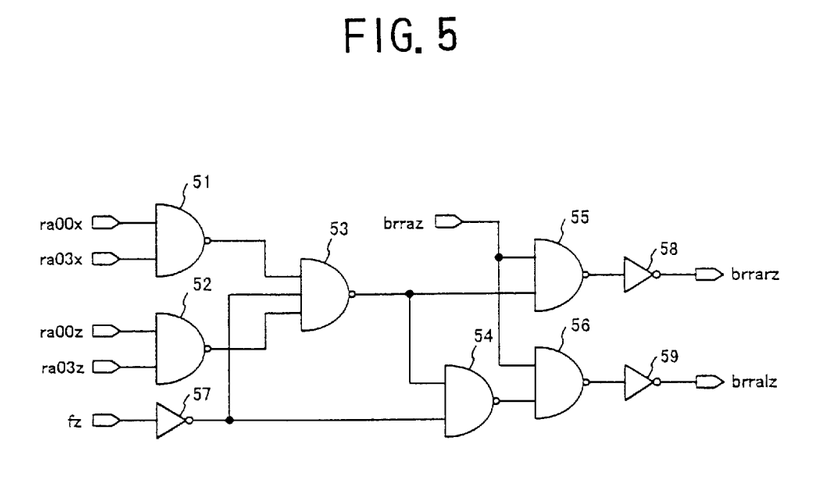
FIG. 5 is a circuit diagram showing an embodiment of a circuit that produces a block selection signal.

FIG. 5 is a circuit diagram showing an embodiment of a circuit that produces a block selection signal.

The circuit of FIG. 5 includes NAND circuits 51 through 56 and inverters 57 through 59, and generates a block selection signal for selecting a line or lines of sense amplifiers that are activated. Activated sense amplifiers are determined by the arrangement of cells and word lines. Since the activated sense amplifiers are determined by the least significant bit (signal ra00) of the sub-word line and the least significant bit (signal ra03) of the main word line, these signals are used. When the signal fz is HIGH, the circuit is configured to activate both a block selection signal brrarz and a block selection signal brra1z.

Figure 6:
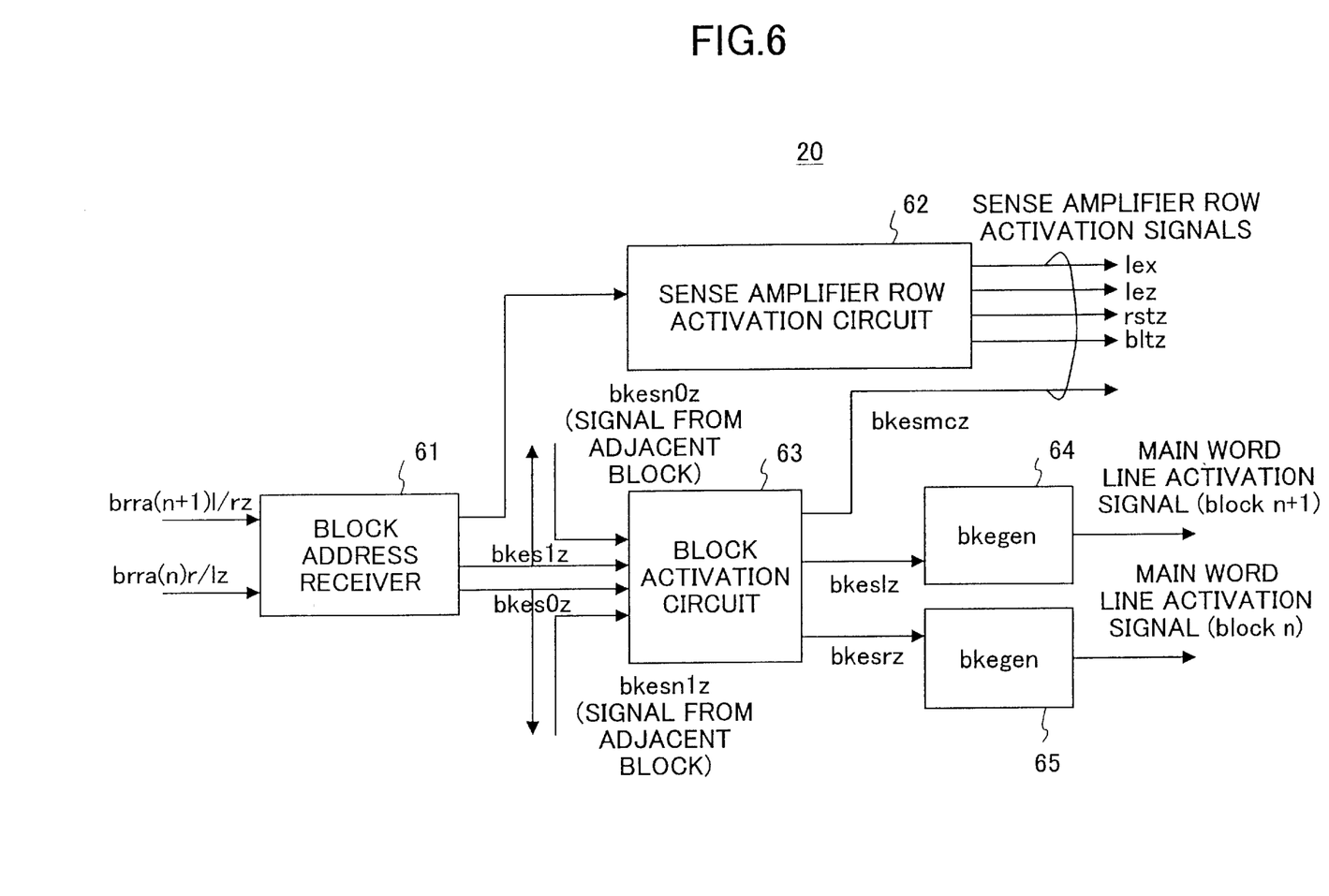
FIG. 6 is a block diagram of a sense-amplifier-line-activation signal generation circuit.

FIG. 6 is a block diagram of the sense-amplifier-line-activation signal generation circuit 20.

The sense-amplifier-line-activation signal generation circuit 20 of FIG. 6 includes a block address receiver 61, a sense amplifier row activation circuit 62, a block activation circuit 63, and main-word-line-activation signal generation circuits 64 and 65. The block address receiver 61 receives block selection signals corresponding to two adjacent blocks among the block selection signals generated by a multiple of circuits equivalent to the circuit of FIG. 5. This is because these two adjacent block selection signals correspond to an address for which the relevant sense amplifiers need to be activated.

In the present invention, there is a need to activate only one line of sense amplifiers. Because of this, a sub-word-decoder-activation signal generation circuit needs to be activated in a sense amplifier row that is not activated. To this end, the block activation circuit 63 is provided, and receives the signals bkesn0z and bkesn1z from adjacent sense-amplifier-line-activation signal generation circuits 20, thereby generating a signal bkesmcz that is a sense amplifier activation signal. In this configuration, therefore, the sense amplifier row activation signal bkesmcz is generated when either one of the adjacent sense amplifier rows is activated even when the block address receiver 61 is unselected.

Accordingly, the signal bkesmcz generated by the block activation circuit 63 is activated, even when a corresponding block selection signal is inactive, as long as one of the adjacent sense amplifier rows is activated.

Figure 7:
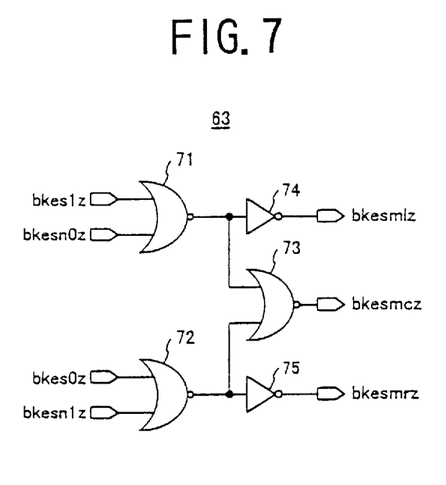
FIG. 7 is a circuit diagram of a block activation circuit.

FIG. 7 is a circuit diagram of the block activation circuit 63.

As shown in FIG. 7, the block activation circuit 63 includes NOR circuits 71 through 73 and inverters 74 and 75. The block activation circuit 63 receives signals bkes0z and bkes1z from the corresponding block address receiver 61, and also receives the signals bkesn0z and bkesn1z from block address receivers 61 of the adjacent sense-amplifier-line-activation signal generation circuits 20. This configuration insures that the signal bkesmcz is activated as long as one of the adjacent sense amplifier rows is activated even when the corresponding block selection signal is not active.

Figure 8:
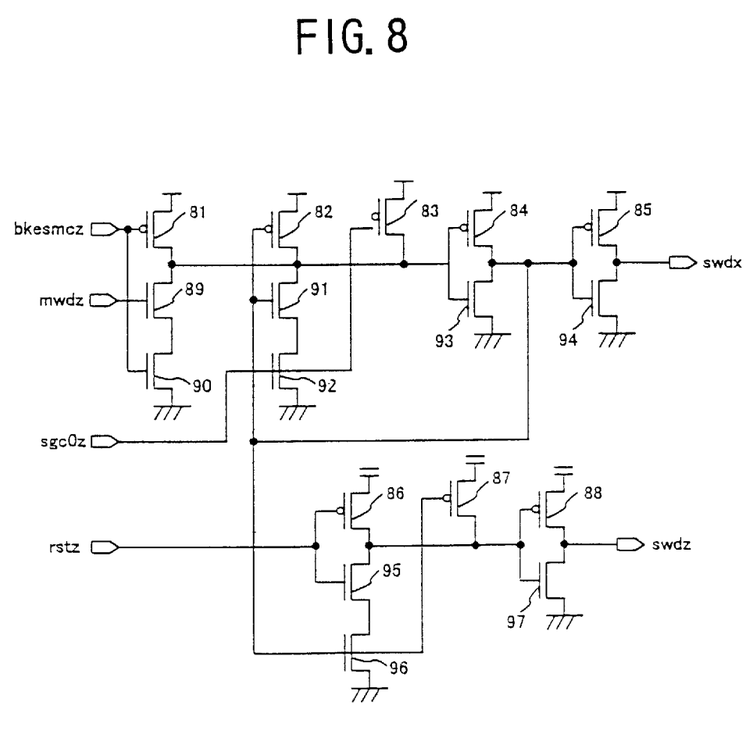
FIG. 8 is a circuit diagram of a sub-word-decoder-activation signal generation circuit.

FIG. 8 is a circuit diagram of a sub-word-decoder-activation signal generation circuit.

The sub-word-decoder-activation signal generation circuit includes PMOS transistors 81 through 88 and NMOS transistors 89 through 97. The sub-word-decoder-activation signal generation circuit receives the signals bkesmcz and rstz shown in FIG. 6, and further receives a ⅛ decode signal mwdz for selecting a sub-word line. Also, a signal sgc0z, for example, is supplied as a segment selection signal sgcz, which will be described later in detail. The segment selection signal sgcz becomes HIGH when the corresponding segment is selected, and becomes LOW when it is unselected. By supplying an activated segment signal sgc0z or sgc1z as the segment selection signal sgcz, it is possible to activate a sub-word line only in the activated segment. Here, output signals swdz and swdx become HIGH and LOW, respectively, when activated. In this specification, a signal having a signal name with "z" at the end is a positive logic signal, and a signal having a signal name ending with "x" is a negative logic signal.

With reference to FIG. 6 again, the sense amplifier row activation circuit 62 generates signals lex, lez, rstz, and bltz for activating sense amplifiers in a sense amplifier row for which the block selection signal brralz or brrarz becomes HIGH. As shown in FIG. 5, when the signal fz is HIGH, both of the block selection signals brralz and brrarz become HIGH.

Further, the main-word-line-activation signal generation circuits 64 and 65 activate a main-word decoder so that the main-word decoder is placed in a condition for accepting address decode signals.

Figure 9:
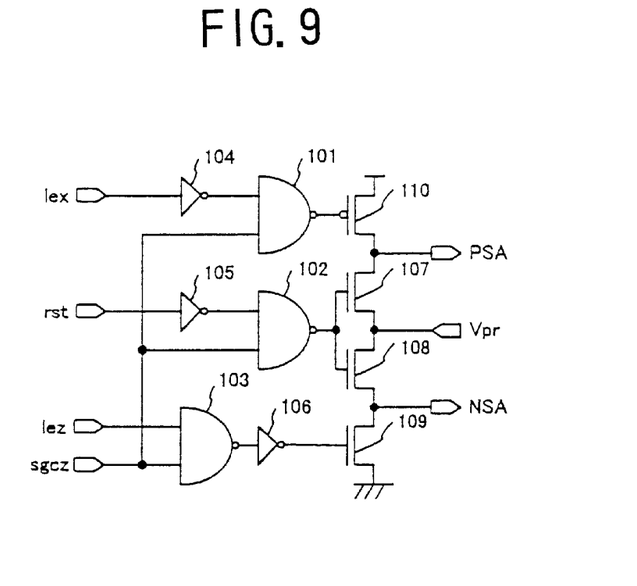
FIG. 9 is a circuit diagram showing a configuration of a sense amplifier driver.

FIG. 9 is a circuit diagram showing a configuration of a sense amplifier driver.

Figure 10:
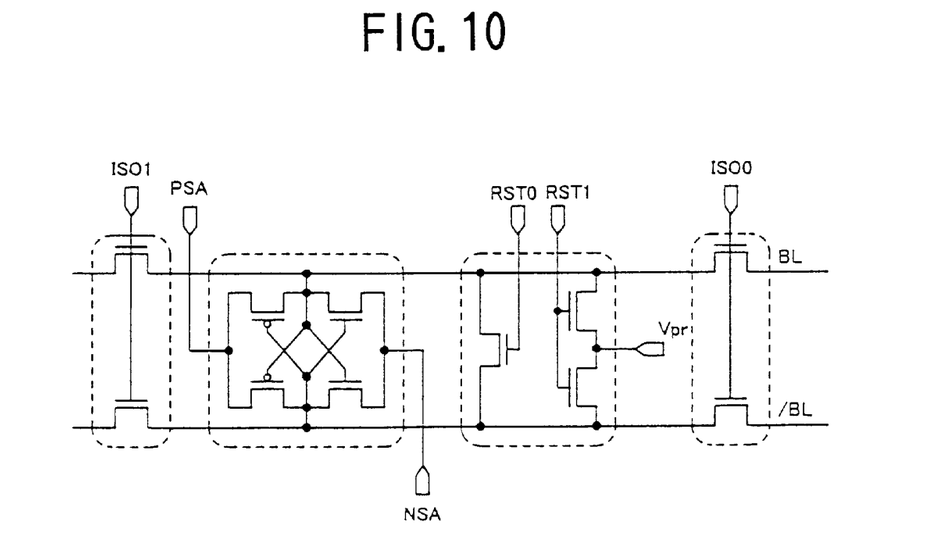
FIG. 10 is a circuit diagram showing a configuration of a sense amplifier.

The sense amplifier driver of FIG. 9 includes NAND circuits 101 through 103, inverters 104 through 106, NMOS transistors 107 through 109, and a PMOS transistor 110. The sense amplifier driver receives the signal lex, lez, and rst from the sense amplifier row activation circuit 62 of FIG. 6, and also receives the segment selection signal sgcz. The segment selection signal sgcz (sgc0z or sgc1z) becomes HIGH when the corresponding segment is selected, and becomes LOW when it is unselected. Based on this, signals PSA and NSA that activate sense amplifiers upon the selection of the corresponding segment are supplied to the sense amplifier circuits as shown in FIG. 10. In FIG. 10, nodes IS01 and IS01 receive an inverse of the signal bltz that is output from the sense amplifier row activation circuit 62 shown in FIG. 6.

Figure 11:
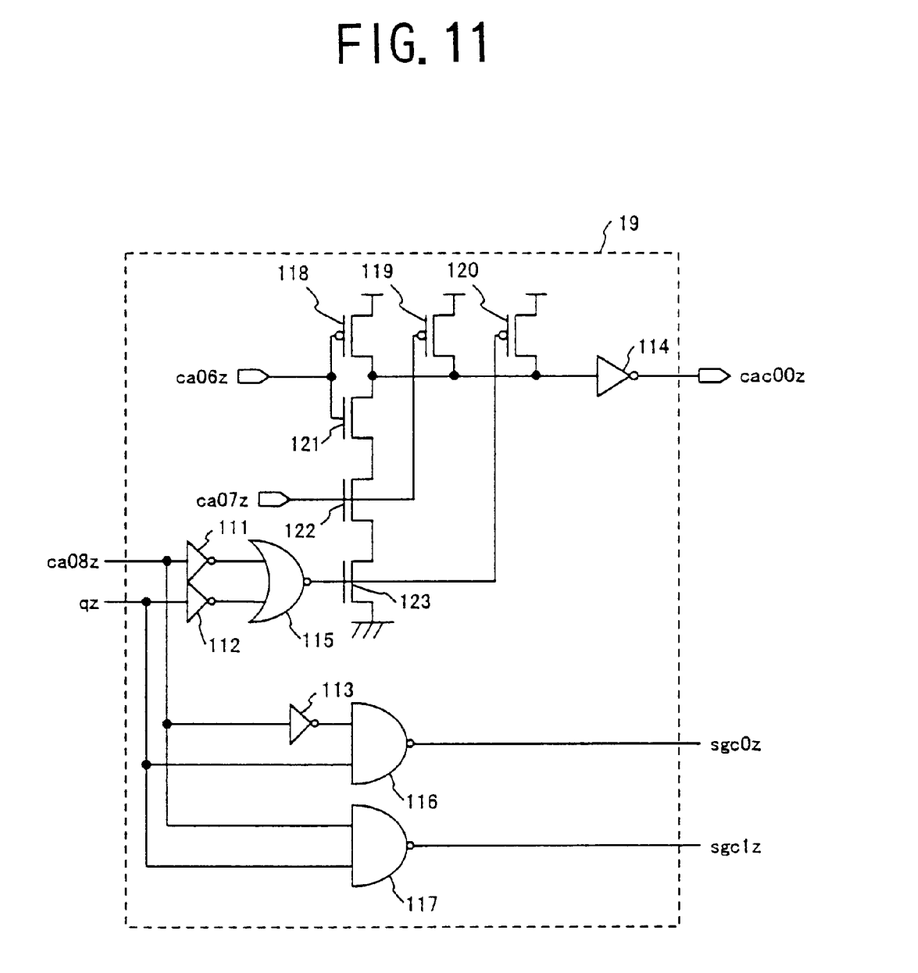
FIG. 11 is a circuit diagram of a column-segment-activation signal generation circuit.

FIG. 11 is a circuit diagram of the column-segment-activation signal generation circuit 19.

The column-segment-activation signal generation circuit 19 of FIG. 11 includes inverters 111 through 114, a NOR circuit 115, NAND circuits 116 and 117, PMOS transistors 118 through 120, and NMOS transistors 121 through 123. The column-segment-activation signal generation circuit 19 receives the signal qz from the DQ-quantity-selection signal generation circuit 13, and also receives the sixth bit ca06z through the eighth bit ca08z of the column address. Based on these signals, the column-segment-activation signal generation circuit 19 outputs a column decoder activation signal cacz (cac00z in FIG. 11), and also outputs the segment selection signal sgcz (sgc0z or sgc1z).

There are eight locations (eight circuits) from cac00z to cac07z. Only a single path that produces the signal sgc0z or the signal sgc1z is provided at each of these eight locations. In this case, the path for the signal sgc0z is provided for a lower half of the column addresses, and the path for the signal sgc1z is provided for a upper half of the column addresses.

When the signal qz is LOW, the eighth bit ca08z of the input column address becomes irrelevant. As a result, the number of column blocks for which the column decoder activation signal cacz is HIGH will be twice as many as when the signal qz is HIGH. In other words, when the signal qz becomes HIGH, the number of activated column blocks becomes half as many.

Moreover, which one of the segment selection signal sgc0z and the segment selection signal sgc1z becomes HIGH is another difference between the HIGH state of the signal qz and the LOW state of the signal qz.

The segment selection signal sgcz (sgc0z or sgc1z) is supplied to the circuit of FIG. 8 and the circuit of FIG. 9, thereby activating sub-word-selection signal generation circuits and sense amplifiers only in the activated segment.

Figure 12:
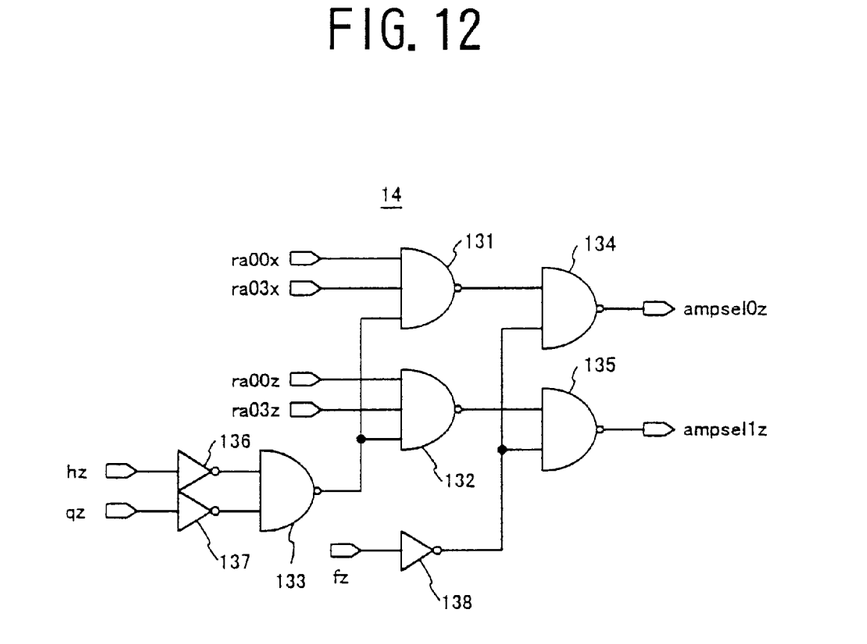
FIG. 12 is a circuit diagram showing a circuit configuration of a data-bus-amplifier-selection signal generation circuit.

FIG. 12 is a circuit diagram showing a circuit configuration of the data-bus-amplifier-selection signal generation circuit 14.

The data-bus-amplifier-selection signal generation circuit 14 of FIG. 12 includes NAND circuits 131 through 135 and inverters 136 through 138. The data-bus-amplifier-selection signal generation circuit 14 receives row address signals ra00x, ra00z, ra03x, and ra03z, and also receives the signals fz, hz, and qz, only one of which is HIGH at a time. When the signal fz is HIGH, outputs ampse10z and ampsel0z are both HIGH, thereby selecting all data bus amplifiers 17 within a segment corresponding to the activated sense amplifier rows. When the signal hz or the signal qz is HIGH, half the amplifiers are selected within a segment corresponding to the activated sense amplifier rows.

Figure 13:
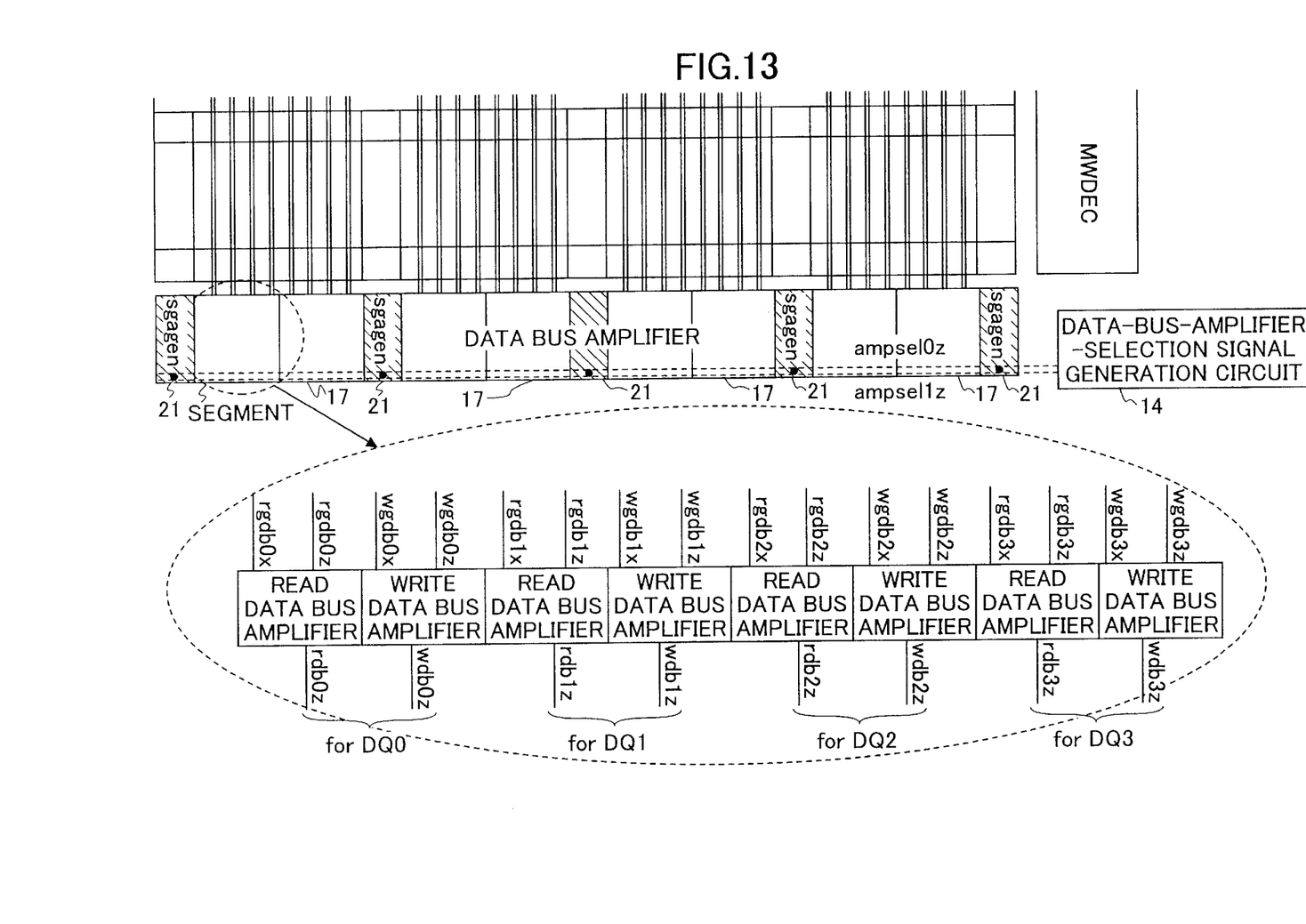
FIG. 13 is an illustrative drawing showing the arrangement of a data bus amplifier and the data-bus-amplifier-selection signal generation circuit.

FIG. 13 is an illustrative drawing showing the arrangement of the data bus amplifier 17 and the data-bus-amplifier-selection signal generation circuit 14.

As shown in FIG. 13, the data-bus-amplifier selection signals ampse10z and ampse11z are supplied to each segment of the data bus amplifier 17. Here, one segment corresponds to half the portion sandwiched between the adjacent amplifier-segment-activation signal generation circuits 21. In FIG. 13, a total of eight segments are shown.

Figure 14:
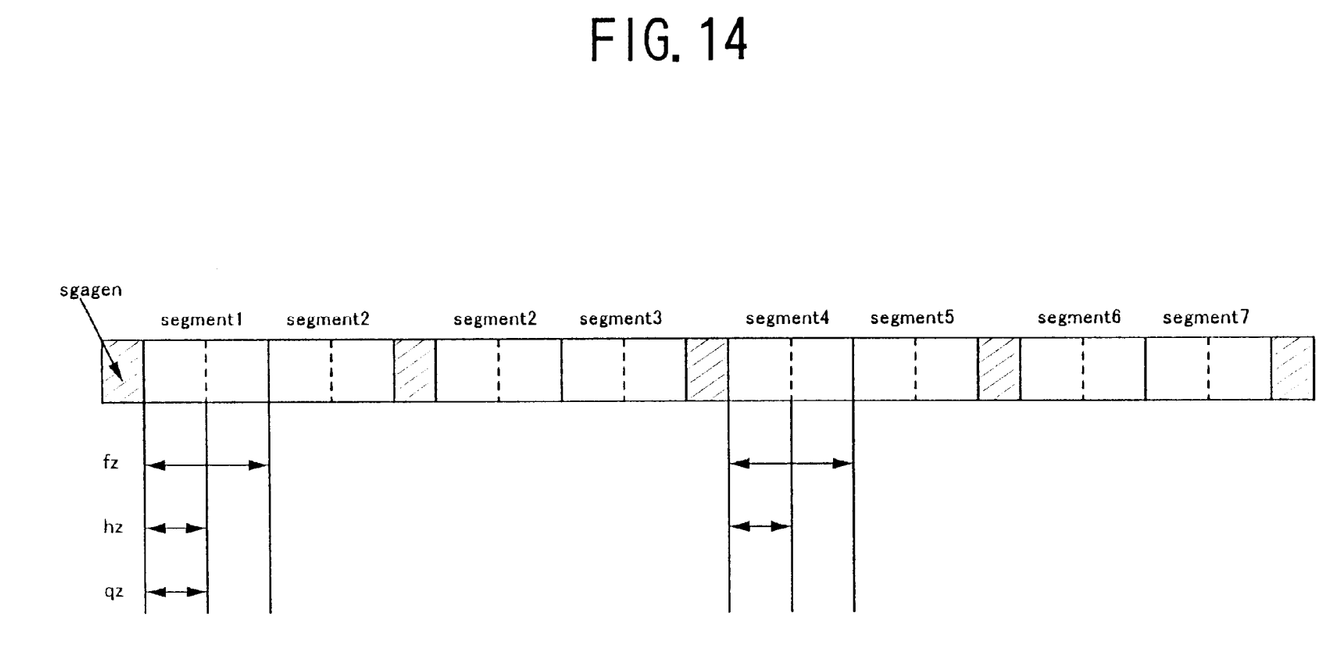
FIG. 14 is an illustrative drawing showing the arrangement of activated segments of the data bus amplifier.

FIG. 14 is an illustrative drawing showing the arrangement of activated segments of the data bus amplifier 17.

As shown in the figure, when the signal fz is HIGH, all bus amplifiers are activated in two selected segments. When the signal hz is HIGH, half the bus amplifiers are activated in the two selected segments. Further, when the signal qz is HIGH, half the bus amplifiers are activated in one selected segment. The data-bus-amplifier selection signals ampsel0z and ampsel1z control whether all the bus amplifiers or half the bus amplifiers are driven. Activated segments are determined by the amplifier-segment-activation signal generation circuit 21 based on the column address.

Figure 15:
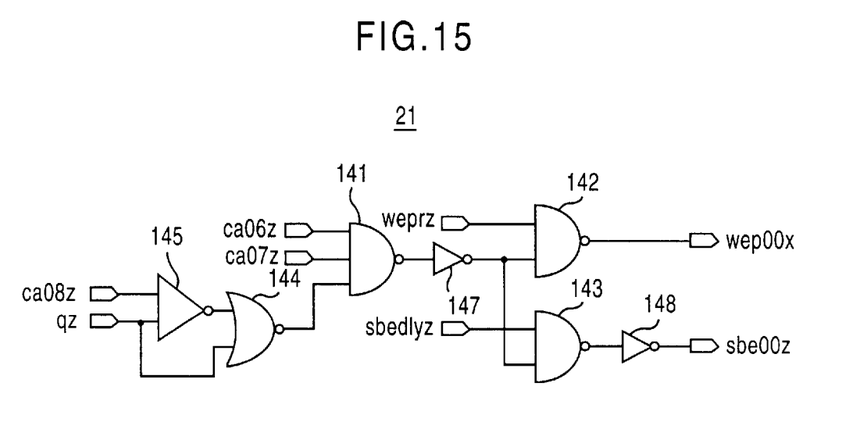
FIG. 15 is a circuit diagram showing a circuit configuration of an amplifier-segment-activation signal generation circuit.

FIG. 15 is a circuit diagram showing a circuit configuration of the amplifier-segment-activation signal generation circuit 21.

The amplifier-segment-activation signal generation circuit 21 of FIG. 15 includes NAND circuits 141 through 145, and inverters 147 and 148.

Input signals weprz and sbedlyz determines data write timing and data read timing. Output signals wep00x and sbe00z activate a write-data-bus amplifier and a read-data-bus amplifier of the data bus amplifier 17, respectively. The signal web00x is LOW in an active state thereof, and the signal sbe00z is HIGH in an active state thereof. When the signal qz is HIGH, the column address bit ca08z is used in addition to the column address bits ca06z and ca07z for the purpose of determining an activated segment. This makes it possible to select a single segment. When the signal qz is LOW, the column address ca08z is merged, thereby selecting two segments at once. Circuits similar to the circuit of FIG. 15 are used for different combinations of column address bits ca06z, ca07z, and ca08z to attend to similar processing. For example, a circuit for a combination of column address bits ca06x (inverse of ca06z), ca07z, and ca08x (inverse of ca08z) may be used. In this manner, signals sbe00z, sbe01z, sbe02z, and so on are generated that correspond to respective column segments.

Each portion of the data bus amplifier 17 receives the signal sbez (one of sbe00z, sbe01z, sbe02z, and so on) from the amplifier-segment-activation signal generation circuit 21, and also receives the signal ampselz (one of ampse10z and ampse11z) from the data-bus-amplifier-selection signal generation circuit 14 of FIG. 12. A logic product of the signal sbez and the signal ampselz is obtained to determine whether to activate the corresponding portion of the data bus amplifier.

According to the present invention as described above, the number of sense amplifiers that are simultaneously activated is controlled in response to the DQ-quantity-selection signal indicative of the number of input/output data bits, thereby achieving a reduction in the current consumption of the semiconductor memory device. Further, a circuit configuration and architecture substantially similar to related-art semiconductor memory devices are used, thereby avoiding an excessive cost increase.

Further, the present invention is not limited to these embodiments, but various variations and modifications may be made without departing from the scope of the present invention.

The present application is based on Japanese priority application No. 2000-199715 filed on Jun. 30, 2000, with the Japanese Patent Office, the entire contents of which are hereby incorporated by reference.

What is claimed is:

1. A semiconductor memory device, comprising:
   a DQ-quantity-selection signal generation circuit which generates a DQ-quantity-selection signal indicative of a number of input/output data bits;
   bit lines which transfer read data and write data for memory cells; and
   a plurality of sense amplifiers which are connected to said bit lines, wherein a number of activated sense amplifiers corresponds to a value of the DQ-quantity-selection signal.

2. The semiconductor memory device as claimed in claim 1, wherein each of said sense amplifiers is connected to a pair of the memory cells via a pair of said bit lines, said pair of the memory cells storing therein complementary data.

3. The semiconductor memory device as claimed in claim 1, further comprising:
   input/output terminals through which data is output to and input from an exterior of said semiconductor memory device;
   data bus amplifiers which are situated between said sense amplifiers and said input/output terminals, and amplify the read data and the write data; and
   a data bus amplifier selection circuit which selectively activates the data bus amplifiers in accordance with the DQ-quantity-selection signal.

4. The semiconductor memory device as claimed in claim 3, wherein said data bus amplifier selection circuit receives row address signals, and selectively activates the data bus amplifiers in accordance with the DQ-quantity-selection signal and the row address signals.

5. The semiconductor memory device as claimed in claim 1, further comprising a circuit which activates circuitry contained in a sense amplifier row that is not activated.

6. The semiconductor memory device as claimed in claim 1, further comprising a column-segment activation circuit which selectively activates one or more column segments in accordance with the DQ-quantity-selection signal.

7. The semiconductor memory device as claimed in claim 6, wherein said sense amplifiers are selectively activated by a column address.

8. The semiconductor memory device as claimed in claim 1, further comprising:
   word lines for selecting the memory cells in response to a row address; and word decoders which selectively activate the word lines, wherein two of said word decoders are selected to activate two of the word lines when the number of input/output data bits is a predetermined number.

* * * * *